United States Patent [19]

Johnson et al.

[11] Patent Number: 5,023,940
[45] Date of Patent: Jun. 11, 1991

[54] LOW-POWER DSP SQUELCH

[75] Inventors: Mark J. Johnson, Algonquin; James D. Solomon, Hoffman Estates, both of Ill.

[73] Assignee: Motorola, Inc., Schaumburg, Ill.

[21] Appl. No.: 401,699

[22] Filed: Sep. 1, 1989

[51] Int. Cl.⁵ .............................................. H04B 1/10
[52] U.S. Cl. .................................. 455/212; 455/222; 455/337; 455/343; 375/103
[58] Field of Search ............... 455/212, 213, 214, 215, 455/222, 224, 225, 218, 336, 337, 343; 375/102, 104, 82, 83, 88, 103; 329/319–321, 325, 327; 331/23

[56] References Cited

U.S. PATENT DOCUMENTS

| 4,117,410 | 9/1978 | Bender | 331/23 |
| 4,603,300 | 7/1986 | Welles, II et al. | 375/82 |
| 4,618,967 | 10/1986 | Vance et al. | 375/88 |
| 4,704,582 | 11/1987 | Dixon et al. | 375/83 |

Primary Examiner—Curtis Kuntz
Attorney, Agent, or Firm—Joseph P. Krause

[57] ABSTRACT

An improved method of statistically determining the presence of noise on an FM communications channel permits digital signal processing techniques to more reliably squelch unnecesssary segments of an FM receiver reducing noise and power consumption. Digital samples of an FM signal having real (in-phase) and imaginary (phase quadrature) components representing the real and imaginary components of a phasor rotating about the origin of a Cartesian coordinate system at a rate indicative of a signal on the channel are mathematically operated on. Successive digital samples are multiplied by the complex conjugate of temporally adjacent samples producing a new stream of phasors representative of the phase change between samples. The phase changes between samples are processed to produce a number that indicates the probability of the channel having noise present. This number indicative of the probability of noise content is compared to a threshold value and used to decide whether or not successive receiver stages should be squalched or unsquelched.

10 Claims, 1 Drawing Sheet

5,023,940

LOW-POWER DSP SQUELCH

BACKGROUND OF THE INVENTION

This invention relates to squelch systems. In particular this invention relates to squelch systems used in frequency modulation (FM) receives to disable stages of the receiver when signal is absent.

Typical squelch circuits in FM receivers test the output of the discriminator and disable the output of the audio amplifier stage of the receiver when there is no signal present on the channel. These squelch circuits therefore require that the discriminator remain active in the standby mode of the receiver. While squelch circuits principally eliminate unwanted white noise from being heard at the speaker output they can also substantially extend the life of a battery powering a portable FM receiver by powering down unneeded stages in the receiver when signal is absent from the channel.

Digital signal processors (DSP's), which use relatively large amounts of power and which are becoming commonplace in FM receivers, frequently perform the function of a discriminator, a function previously performed by relatively low-power analog circuits. Powering a DSP however to continuously perform a discriminator function to squelch the radio's audio system would waste substantial amounts of power. Using a DSP squelch algorithm not requiring the output of a discriminator but permitting the DSP to be disabled when its not required could substantially extend the life of a battery powering a portable radio that uses DSP's.

SUMMARY OF THE INVENTION

A method of detecting information on an FM channel is disclosed which operates on digital samples of non-demodulated signals. The non-demodulated signal is a stream of digital complex numbers that have real and imaginary components. The real and imaginary components, denoted I and Q, are the in-phase and quadrature components respectively of a phasor that rotates about the origin of a set of Cartesian coordinates having imaginary components along the Y axis and real components along the X axis. (When an FM signal is present on a receiver channel, the phasor rotates about the origin at a rate related to the instantaneous deviation of the FM modulating signal plus the frequency offset of the modulating signal from the center frequency of the channel.) These I and Q components are digitally filtered to reduce noise components in the FM signal. The filtering removes undesired frequency components outside the bandwidth of interest at, for example, the first IF stage.

After filtering, each complex sample in the stream of samples is multiplied by the complex conjugate of a temporally adjacent sample to produce another stream of complex phasors whose angles represent the phase angle difference between the first sample and the temporally adjacent sample of which the complex conjugate was formed.

This product of a first phasor in the stream of phasors and a complex conjugate of a temporally adjacent phasor is performed repetitively on all samples output from the digital-to-analog convertor to produce the second stream of phasors. The phase angles of the phasors formed by the product of the sample and the complex conjugate of an adjacent sample are evaluated statistically to generate a numerical index or value on the probability of the channel content being noise.

The statistical evaluation of the phasors formed by the product of the sample values and the complex conjugate of the sample values numerically weights these phasors according to some appropriate algorithm and accumulates the results obtained by the operation of this algorithm on the phasor samples. The accumulation of results is used to make a decision as to whether or not the FM channel contains signal or noise. If the channel contains noise, other processing in the DSP can be disabled.

Several algorithms or weighting functions are possible as detailed below.

DETAILED DESCRIPTION OF THE PREFERRED EMBODIMENT

Figure 1:
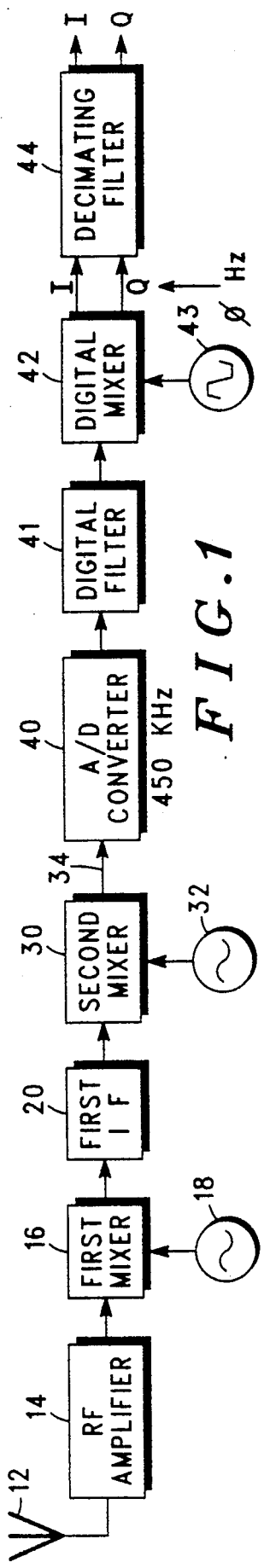
FIG. 1 shows a subsection of the functional blocks required of the FM receiver of the present invention.

FIG. 1 shows the functional elements of an FM receiver front end required by the preferred embodiment of the invention herein. The FM receiver includes an antenna (12), an RF amplifier that amplifies low-level signals (14), a first mixer (16) driven by a local oscillator (18) that shifts the incoming signals to a lower frequency at which the signals are filtered by the first IF (20) to suppress undesired signals and noise in the frequency band of interest.

The output of the first IF (20) is coupled to a second mixer, (30) which mixes the output of the first IF (20) with a second oscillator (32) to produce a second IF signal (34) at a frequency at which a practical A/D converter can operate. (Note that faster A/D's might be able to sample the output of the first mixer or even the output of the RF amplifier but would require more power.)

In the preferred embodiment, the second IF signal (34) is sampled by an A/D converter (40) to produce a stream of real digital numbers. The stream of real digital numbers is digitally band-pass filtered (41) and sent to a digital mixer (42) driven by a digital complex oscillator (43), which oscillates at the 2nd IF frequency. The output of the digital mixer (42) is a stream of complex digital numbers at a center frequency of 0 hz. This stream of samples may then be further low-pass filtered and decimated (44) to obtain a suitably low sample rate. (Decimating effectively divides the data rate of samples from the digital mixer (42) so that digital signal processing can be performed by slower devices.) This sample rate should be at least three to four times the maximum frequency deviation of the expected signal; higher sample rate improve speed and reliability at the cost of processing power.

Figure 2:
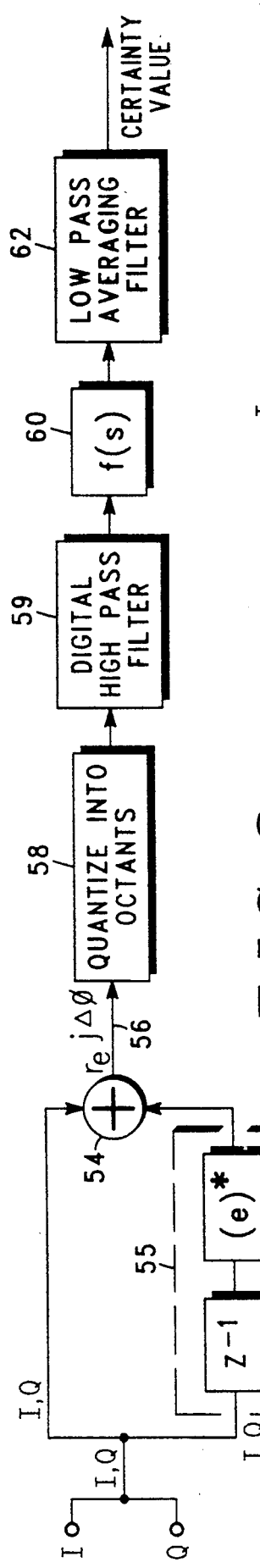
FIG. 2 shows a function block required to perform the invention described herein.

In FIG. 2, the signal processing of the output of the decimating filter (44) is shown in detail. (All processing shown in FIG. 2 is in a digital format using a digital signal processor such as a Motorola 56000 DSP. Programming details of the Motorola DSP 56000 series of signal processors are available in the 56000 series user's manual, Motorola Publication No. DSP56000UM/AD rev. 1. A listing of the program for the preferred embodiment of the squelch system shown in FIG. 2 is given below.)

As described above, each complex sample in the stream of samples from the decimator (44) is multiplied (54) by the complex conjugate of a temporally adjacent sample (55) to produce a second stream of phasors (56) whose phase angles represent the differences between the phases of the two samples multiplied in the multiplier (54). (The two samples multiplied in the multiplier are actually pairs of samples, being a first sample and the complex conjugate of a temporally adjacent second sample. The temporal ordering of the first and second samples from the decimator is arbitrary. The complex conjugate sample can either temporally precede or follow the other sample.) These phase differences can be considered to be the instantaneous deviation of the frequency of the received signal or noise from the center of the channel. When there is an FM signal on the channel, the deviation is limited by the transmitter and should be less than the maximum allowable deviation depending on the channel specification. If there is noise on the channel, the deviation is not limited since noise does not have the constant-envelope property of a frequency-modulated signal and the phase (56) output from the multiplier (54) may even pass through or near the origin ($I=0$, $Q=0$) at any time, resulting in large instantaneous frequency deviations.

To determine whether the channel contains noise, this angular deviation phasor (56) is tested by a digital signal processor using relatively simple instruction cycles to determine the phase angle of the phasor with respect to the X axis. While it is burdensome to calculate the exact phase angle of this phasor, it is adequate to consider a more approximate, or quantized, value which is considerably easier to calculate. The phase angles of these phasors are quantized (58) into one of either sectors or octants. Quantizing the phasors produces a stream of real numbers which are evaluated to permit predicting that the channel contains noise. Since these real numbers representing the quantized phasor angles have finite resolution. In the preferred embodiment, the phase angles of the phases were quantized into octants of 45° each.

Figure 3:
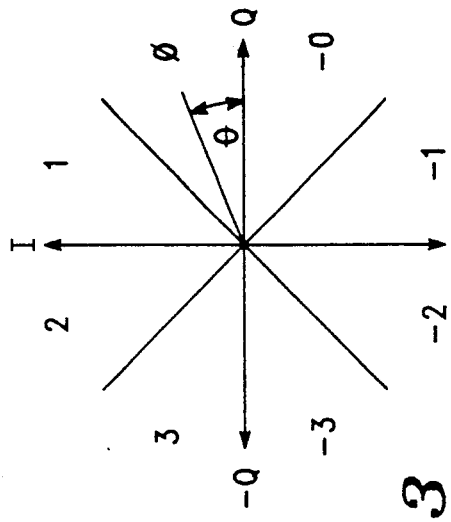
FIG. 3 shows a set of Cartesian coordinates having imaginary and real axes.

FIG. 3 shows a cartesian coordinate system of I and Q axes divided into eight octants. The octants are numbered 0 through $+3$, counterclockwise above the Q axis. Octants below the Q axis are numbered $-0$ to $-3$, clockwise. In the preferred embodiment, the numbering of the octants corresponds to the value assigned to a phasor falling anywhere within that octant, thereby quantizing phasors into one of eight octants.

After being quantized (58) the phasor angles are high-pass filtered (59) to eliminate DC content in the phasors (56) from a small frequency offsets between the transmitter and receiver frequencies.

Statistical analysis of the angles of successive phasors (60) generates a numerical index which indicates the probability that the channel contains noise and not information. If many of the angles of the phasors lie in the positive or negative third or fourth octants (octants 2, 3, $-2$ and $-3$ shown in FIG. 3), there is a substantial probability that the channel contains noise. If the angles of the phasors lie predominantly in the first and second octants (octants 0, 1, $-0$ and $-1$) the channel likely contains an FM modulated signal.

Output of the filter (59) is weighted by a mathematical weighting function (60) which permits more reliable evaluation of the probability that the channel contains noise. In one embodiment, the weighting function (60) numerically squares the output of the filter (59) to produce a second value. Squaring the quantized phasors, some of which have negative values such as $-3$, 2, or $-1$, yields a string of positive numbers. The string of positive numbers is used to generate a certainty value or number, indicative of the probability the channel contains noise. Alternatively, the weighting function could calculate the absolute value of the product of two distinct samples from the filter (59) as implemented in the assembly language listing appended below. Other weighting functions may be used depending on the characteristics of the expected signal.

The output of the weighting function (60) is averaged or low-pass filtered (62) to produce an averaged result. The averaged result is indicative of the probability of noise present in the channel. Using the weighting functions described above, the value output by the averaging filter (62) will be lower is signal is present in the channel than if the channel contains only noise. The detection threshold or thresholds may be set depending on the sensitivity desires. A value above the threshold represents noise on the channel; a value below the threshold indicates the presence of a desired signal.

The output of the integrator circuit (62) may be passed to a digital comparator algorithm (not shown) which can compare accumulated value in the integrator (62) to the aforementioned threshold. Depending upon the value chosen for the reference value in the comparator, a decision can be made to squelch or unsquelch subsequent signal processing circuits in the receiver thereby saving power or to enable the signal processing circuits and turn on the output.

The following source code performs the functions of FIG. 2.

```
;***********************************************
;
; This code segment is called as a subroutine
;
; Inputs:
;   - I in accumulator A
;     Q in accumulator B
;
; Output:
;   - Squelch on or off flag.
;
```

```
; NOTE:
;       flag = 1 =>  squelch ON  (active)    => weak signal  => audio OFF
;       flag = 0 =>      "       OFF (inactive) => strong    "    =>   "    ON
;
; Algorithm:
;       1)  Accumulate a function of the number of octant boundaries
; crossed by the RF phasor.
;       2)  Use 1 to determine whether squelch is open or closed
;
; Misc Constants . . .
;
SAMPLES     EQU     167
SQON        EQU     0

;
; Misc. Storage
;
        ORG     XL:$0000
;
TIMER       DC      SAMPLES
ACCUM       DC      0
LO_THR      DC      $40
HI_THR      DC      $80
GPFLAG      DC      0
OLDOCT      DC      0
OLDDIFF     DC      0
OLD_I       DC      0
OLD_Q       DC      0
RESET       DC      SAMPLES
;
;***********************************************
;
;***********************************************
;
; Part I)  Accumulate a function of the octant crossings
;
        ORG     PL:$0040
;
SSQLCH      MOVE    A,X0
            MOVE    B,Y0
            MOVE    X:OLD_I,X1
            MOVE    X:OLD_Q,Y1
;
; 1) Compute f[k] = z[k] times z*[k-1] whose phase equals the RF
; phase change.
```

```
;
    MPY  X0,X1,A    X0,X:OLD_I
    MAC  Y0,Y1,A Y0,X:OLD_Q
    MPY  X1,Y0,B
    MAC  -X0,Y1,B #<$7F,X0
;
; 2) Determine the octant of f[k] = A: Re{f[k]} + j B: Im{f[k]}
;    and load the proper bias number.
;
    JLE  <OCT3456                        ; If re<=0 then oct=3,4,5,6
;
OCT1278 CMPM  B,A   #<$80,A              ; else is |re|>|im| ?
    JGT  <OCT18                          ; if so, octant = 1 or 8
;
OCT27    TST  B     X:<OLDOCT,Y0         ; else is im > 0?, A=-1.0
    MOVE  #>1,X1                         ;X1 = |Oct|
    JMP  <CONTIN
;
OCT18    MOVE #<0,X1
    MOVE X:<OLDOCT,Y0
    JMP  <CONTIN
;
OCT3456 CMPM  B,A   #<$80,A              ; else is |re|>|im| ?
    JGT  <OCT45                          ; if so, octant = 4 or 5
;
OCT36    TST  B     X:<OLDOCT,Y0         ; else is im > 0 ?
    MOVE  #>2,X1
    JMP  <CONTIN
;
OCT45    TST  B     X:<OLDOCT,Y0         ; else is im > 0 ?
    MOVE  #>3,X1
;
; A = -1.0, X0 = 1.0, X1 = |Oct|, Y0 = Oct[k-1], N bit (CC) = sign of Q
;
CONTIN   TPL  X0,A
    MOVE    A,X0
    MPYR    X0,X1,A           X:<OLDDIFF,Y1
    SUB  Y0,A       A,X:<OLDOCT
    ABS  A          X:<ACCUM,X0
    MOVE    A,Y0
    MPY  Y0,Y1,A              Y0,X:<OLDDIFF
    TFR  X0,A       A0,X1
    ADD  X1,A       X:<TIMER,B
    MOVE    #>1,X1
    SUB  X1,B       A,X:<ACCUM
```

```
        MOVE    B,X:<TIMER
        JEQ     <DUMP
RTRN    NOP
;
        RTS
;***********************************************************
;
;
;  Part II - SQUELCH DECISION ROUTINE
;
;  PURPOSE:
;     This code compares the algorithm's accumulator with the
;  threshold values to determine whether to turn the SQUELCH on or
;  off.
;
; INPUTS:   A  = ACCUMulator
;           B  = 0
;           X1 = 1
;              a host of miscellaneous values in zero-page memory
;
; OUTPUTS:  GPFLAG (bit 0) = SQUELCH STATE (1 = ON)
;           TIMER gets reset
;
DUMP    MOVE              X:<HI_THR,X0
        CMP   X0,A        X:<LO_THR,X0
        JGE   <TURNON
        CMP   X0,A        X:<RESET,X0
        JLE   <TURNOFF DONTCHG MOVE X0,X:<TIMER
        MOVE B,X:<ACCUM
        JMP  <RTRN
;
TURNON  BSET #SQON,X:<GPFLAG
        MOVE X:<RESET,X0
        MOVE X0,X:<TIMER
        MOVE B,X:<ACCUM
        JMP  <RTRN
;
TURNOFF BCLR #SQON,X:<GPFLAG
        MOVE X0,X:<TIMER
        MOVE B,X:<ACCUM
        JMP  <RTRN

;
;***********************************************************
;
```

What is claimed is:

1. In a frequency modulation (FM) receiver receiving FM signals on a channel, a method of identifying information bearing signals and identifying non-information bearing noise on said channel and for squelching the receiver in the absence of information bearing signals on said channel comprised of the steps of:

converting said FM signals to a stream of temporally adjacent digital samples, said samples representative of said FM signals, each of said temporally adjacent digital samples in said stream of samples being complex and having I (real) and Q (imaginary) components corresponding to the in-phase and quadrature components of complex phasors, each phasor having a magnitude and phase;

determining phase differences between each temporally adjacent pair of samples in said stream of samples;

identifying the contents of said channel as either signal or noise based on statistical evaluation of a plurality of said phase differences; and de-activating signal processing of said FM signals in said receiver upon the determination of the absence of desired signal on said channel.

2. The method of claim 1 including the step of:

before said determination of phase differences between each temporally adjacent pair of samples, filtering said I and Q components to produce a stream of filtered samples having reduced noise components in said digital signal.

3. The method of claim 1 including the step of:

determining the phase difference between each temporally adjacent pair of samples in said stream of samples by multiplying each sample in said signal by the complex conjugate of a temporally adjacent sample to produce a stream of phasors, each phasor having a phase angle representative of the change in phase between said temporally adjacent samples.

4. The method of claim 1 where said statistical evaluation of a plurality of phase angles of said phasors includes the steps of:

producing a second stream of real values of finite resolution representing said phase angles;

producing a stream of weighted values from said second stream, each weighted value produced according to a function operating on one or more of the values of the second stream;

low pass filtering said stream of weighted values to provide a certainty value representing an estimate of the probability of desired signal being present on the channel;

comparing this certainty value of a threshold value and specifying the channel content as either desired signal or noise based on said comparison.

5. The method of claim 4 where the step of producing a second stream of real values of finite resolution representing said phase angles includes the steps of:

identifying said phase angles as being located in predetermined sectors of a Cartesian coordinate system and assigning numerical values to said samples in said second stream according to the sector in which said phasor lies.

6. The method of claim 4 where the step of producing a stream of weighted values from said second stream includes the steps of:

squaring each value in said second stream of values.

7. The method of claim 4 where the step of producing a stream of weighted values from said second stream includes the steps of:

assigning an arbitrary value to each possible value of the second stream dependent upon which sector the phasor lies in.

8. The method of claim 4 where the step of producing a stream of weighted values from said second stream includes the steps of:

calculating the absolute value of the product of the value of a first sample in said second stream and the value of a second sample in said second stream.

9. The method of identifying information of claim 4 where the second stream of real values is filtered to remove DC offset component in said second stream before the weighting operation.

10. The method of identifying information of claim 1 where filtering said I and Q components to reduce noise reduces undesired information signals and non-informational noise.

* * * * *